United States Patent
Linnen et al.

(10) Patent No.: US 11,893,243 B2
(45) Date of Patent: Feb. 6, 2024

(54) STORAGE SYSTEM AND METHOD FOR PROGRAM REORDERING TO MITIGATE PROGRAM DISTURBS

(71) Applicant: Western Digital Technologies, Inc., San Jose, CA (US)

(72) Inventors: Daniel J. Linnen, Naperville, IL (US); Prakash Subedi, San Jose, CA (US); Khanfer A. Kukkady, San Jose, CA (US); Mark Murin, Kfar Saba (IL)

(73) Assignee: Western Digital Technologies, Inc., San Jose, CA (US)

( * ) Notice: Subject to any disclaimer, the term of this patent is extended or adjusted under 35 U.S.C. 154(b) by 259 days.

(21) Appl. No.: 17/495,015

(22) Filed: Oct. 6, 2021

(65) Prior Publication Data

US 2023/0106371 A1    Apr. 6, 2023

(51) Int. Cl.
*G06F 3/06*     (2006.01)
*G06F 12/02*    (2006.01)

(52) U.S. Cl.
CPC .......... *G06F 3/0619* (2013.01); *G06F 3/0604* (2013.01); *G06F 3/0655* (2013.01); *G06F 3/0679* (2013.01); *G06F 12/0246* (2013.01)

(58) Field of Classification Search
CPC ............. G06F 12/0246; G06F 12/0238; G06F 3/0619; G06F 3/0679; G06F 3/065; G06F 3/0688; G06F 3/0655; G06F 3/0638
See application file for complete search history.

(56) References Cited

U.S. PATENT DOCUMENTS

| | | | |
|---|---|---|---|
| 7,218,552 B1 | 5/2007 | Wan et al. | |
| 7,493,457 B2 | 2/2009 | Murin | |
| 8,560,919 B2 | 10/2013 | D'Abreu et al. | |
| 9,076,516 B2 | 7/2015 | Nam et al. | |
| 9,858,002 B1* | 1/2018 | Goss | G06F 3/0619 |
| 10,642,505 B1* | 5/2020 | Kuzmin | G06F 3/0679 |
| 10,733,110 B1* | 8/2020 | Volpe | G06F 3/0656 |
| 10,922,014 B1* | 2/2021 | Henze | G06F 3/0679 |
| 11,249,652 B1* | 2/2022 | Kuzmin | G06F 3/061 |
| 2006/0259718 A1* | 11/2006 | Paley | G11C 16/22 711/159 |
| 2011/0208896 A1* | 8/2011 | Wakrat | G11C 11/5642 711/E12.001 |
| 2013/0268719 A1* | 10/2013 | Dover | G06F 3/065 711/202 |
| 2013/0268724 A1* | 10/2013 | Seo | G06F 11/108 711/103 |
| 2018/0182463 A1* | 6/2018 | Dutta | G06F 3/0619 |

(Continued)

OTHER PUBLICATIONS

Characterizing 3D Floating Gate NAND Flash: Observations, Analyses, and Implications by Xiong (Year: 2018).*

(Continued)

*Primary Examiner* — Paul M Knight
(74) *Attorney, Agent, or Firm* — Crowell & Moring LLP

(57) ABSTRACT

A storage system has a memory that is organized in wordlines. Each wordline has a number of strings. A controller in the storage system changes, in each of the wordlines, which of the strings is a last string programmed. Doing so can unmask a program disturb error when triple-level cells in the memory are used as pseudo-multi-level cells. By unmasking the program disturb error, the controller can detect and correct the error.

16 Claims, 11 Drawing Sheets

(56) References Cited

U.S. PATENT DOCUMENTS

| | | | | |
|---|---|---|---|---|
| 2019/0129641 A1* | 5/2019 | Tanpairoj | .............. | G06F 3/0679 |
| 2021/0064291 A1* | 3/2021 | Kanno | ................ | G06F 12/0246 |
| 2021/0064292 A1* | 3/2021 | Choi | ..................... | G06F 3/0659 |
| 2021/0334211 A1* | 10/2021 | Duan | ................... | G06F 12/0646 |
| 2022/0139459 A1* | 5/2022 | Ahn | ....................... | G11C 16/32 |
| | | | | 711/103 |

OTHER PUBLICATIONS

MathIsFun_Binary Number System 2015 (Year: 2015).*
Solid State Drive Primer NAND Architecture Pages and Blocks Larrivee 2015 (Year: 2015).*
Read Disturb Errors in MLC NAND Flash Memory by Cai 2015 (Year: 2015).*
Adam: Architecture for Write Disturbance Mitigation in Scaled Phase Change Memory by Swami (Year: 2018).*
Error Characterization, Mitigation, and Recovery in Flash Memory Based Solid State Drives by Cai (Year: 2017).*
Error Patterns in MLC NAND Flash Memory: Measurement, Characterization, and Analysis by Cai (Year: 2012).*
Vulnerabilities in MLC NAND Flash Memory Programming: Experimental Analysis, Exploits, and Mitigation Techniques by Cai (Year: 2017).*

* cited by examiner

| Wordline | String0 | String1 | String2 | String3 |
|---|---|---|---|---|
| 0 | 1st | 2nd | 3rd | 4th |
| 1 | 4th | 1st | 2nd | 3rd |
| 2 | 3rd | 4th | 1st | 2nd |
| 3 | 2nd | 3rd | 4th | 1st |
| 4 | 1st | 2nd | 3rd | 4th |
| 5 | 4th | 1st | 2nd | 3rd |
| 6 | 3rd | 4th | 1st | 2nd |
| 7 | 2nd | 3rd | 4th | 1st |
| 8 | 1st | 2nd | 3rd | 4th |
| 9 | 4th | 1st | 2nd | 3rd |
| 10 | 3rd | 4th | 1st | 2nd |
| 11 | 2nd | 3rd | 4th | 1st |
| 12 | 1st | 2nd | 3rd | 4th |
| 13 | 4th | 1st | 2nd | 3rd |
| 14 | 3rd | 4th | 1st | 2nd |
| 15 | 2nd | 3rd | 4th | 1st |
| ... | ... | ... | ... | ... |

STORAGE SYSTEM AND METHOD FOR PROGRAM REORDERING TO MITIGATE PROGRAM DISTURBS

BACKGROUND

Storage systems can be used to store data from a host. The memory of the storage system can be organized in a plurality of blocks of memory cells, where each block comprises a plurality of wordlines. Each wordline can be organized in a plurality of programming segments, or strings. One problem that can occur in programming the memory is that errors can be created in certain memory cells after other memory cells have been programmed. This is referred to as "program disturb." A disturb in a given string can be caused when the other strings in the wordline are being programmed.

BRIEF DESCRIPTION OF THE DRAWINGS

FIG. 6 is an illustration of a program reordering method of an embodiment.

FIG. 8 is an illustration of a program reordering method of an embodiment that varies across memory dies.

DETAILED DESCRIPTION

The following embodiments generally relate to a storage system and method for program reordering to mitigate program disturbs. In one embodiment, a storage system is presented comprising a memory comprising a plurality of wordlines, wherein each wordline comprises a plurality of strings. The storage system also comprises a controller configured to change, in each of the plurality of wordlines, which of the plurality of strings is a last string programmed. In another embodiment, a method is provided comprising: assigning zero to a program stringed count; calculating a current string and wordline; programming data into the current string and wordline; incrementing the programmed stringed count; and calculating a new current string and wordline to be programmed such that a programming order of at least one string varies between wordlines. In yet another embodiment, a storage system is provided comprising a memory comprising a plurality of wordlines, wherein each wordline comprises a plurality of strings; and means for changing, in each of the plurality of wordlines, which of the plurality of strings is a last string programmed. The memory can comprise memory cells configured to store X number of bits per cell, wherein X is a positive integer, and a program disturb error is unmasked when the memory cells are used to store fewer than X number of bits per cell. Changing which of the plurality of strings is the last string programmed allows the program disturb to be corrected. Other embodiments are provided, and each of these embodiments can be used alone or in combination.

Figure 1A:
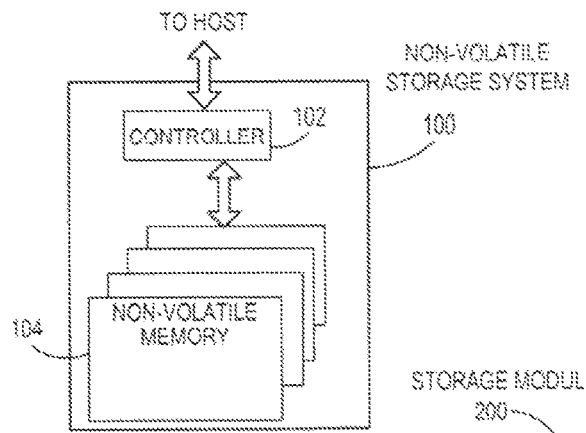
FIG. 1A is a block diagram of a non-volatile storage system of an embodiment.
Figure 1B:
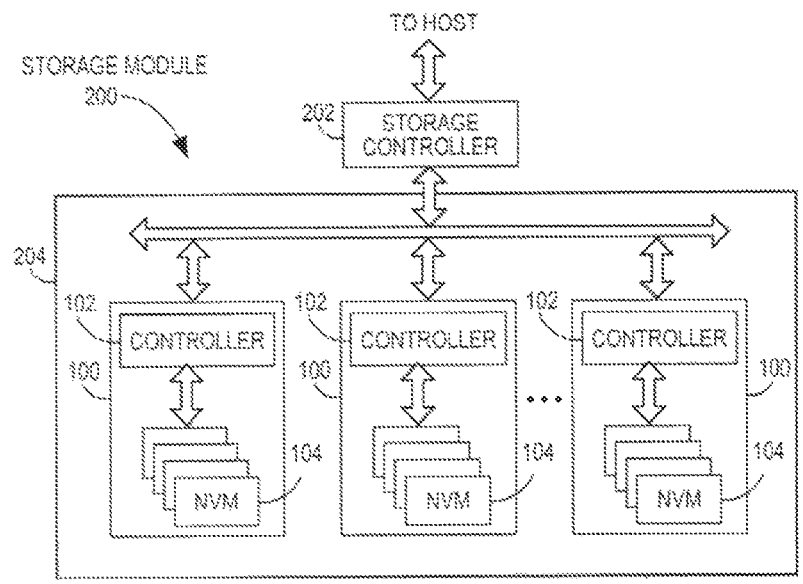
FIG. 1B is a block diagram illustrating a storage module of an embodiment.
Figure 1C:
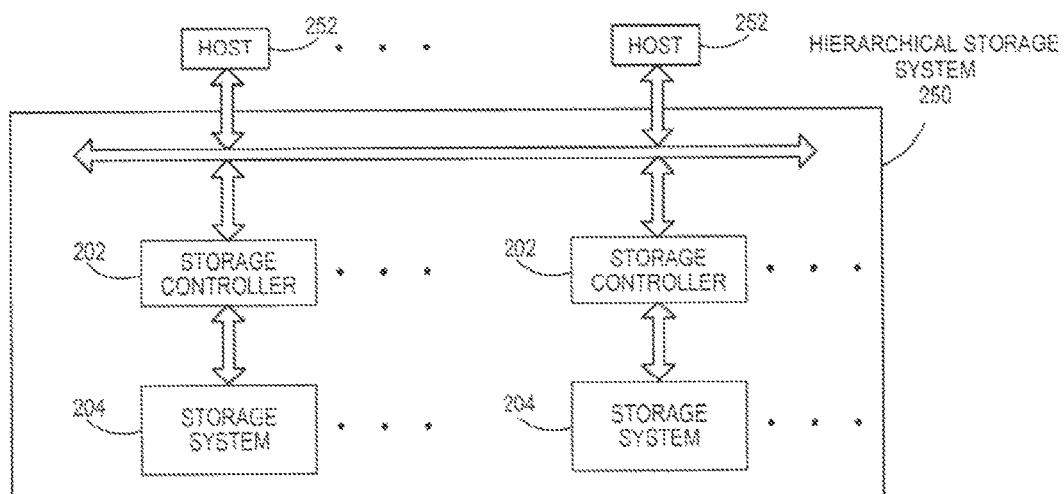
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magneto-resistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory cells that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including ReRAM, MRAM, PCM, NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card-based system, such as a secure digital (SD) or a micro secure digital (micro-SD) card (or USB, SSD, etc.). In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid-state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
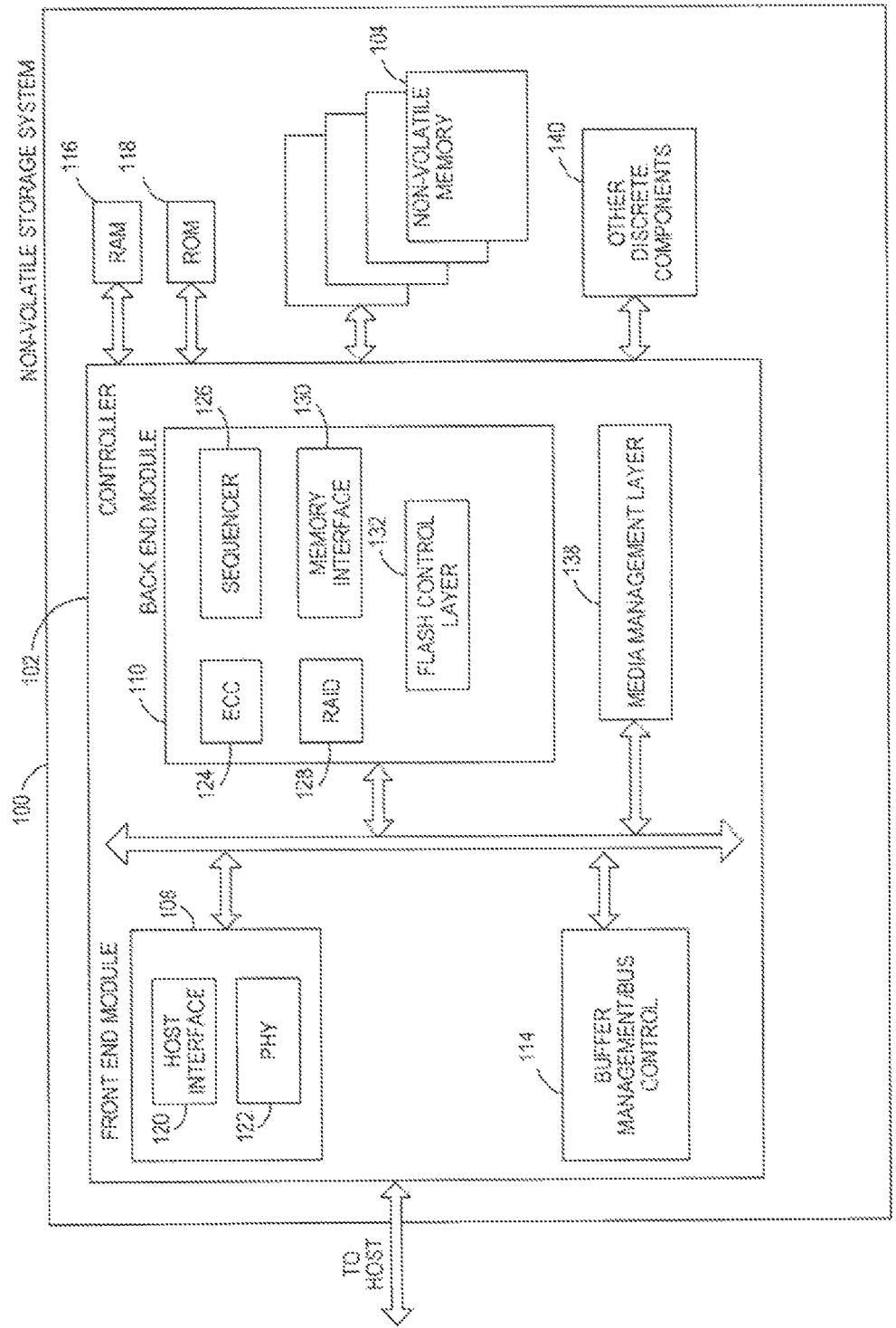
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
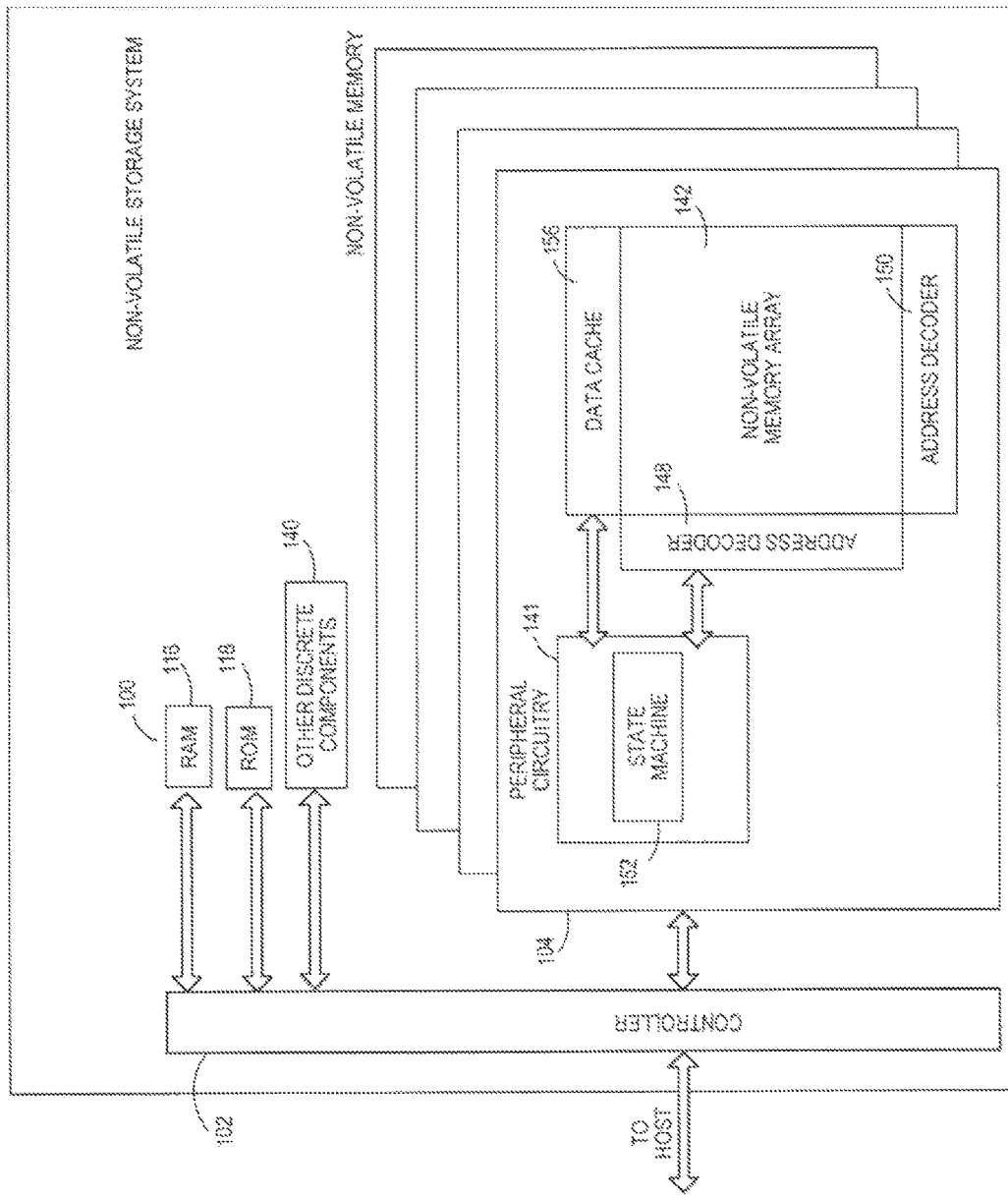
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block of memory cells. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
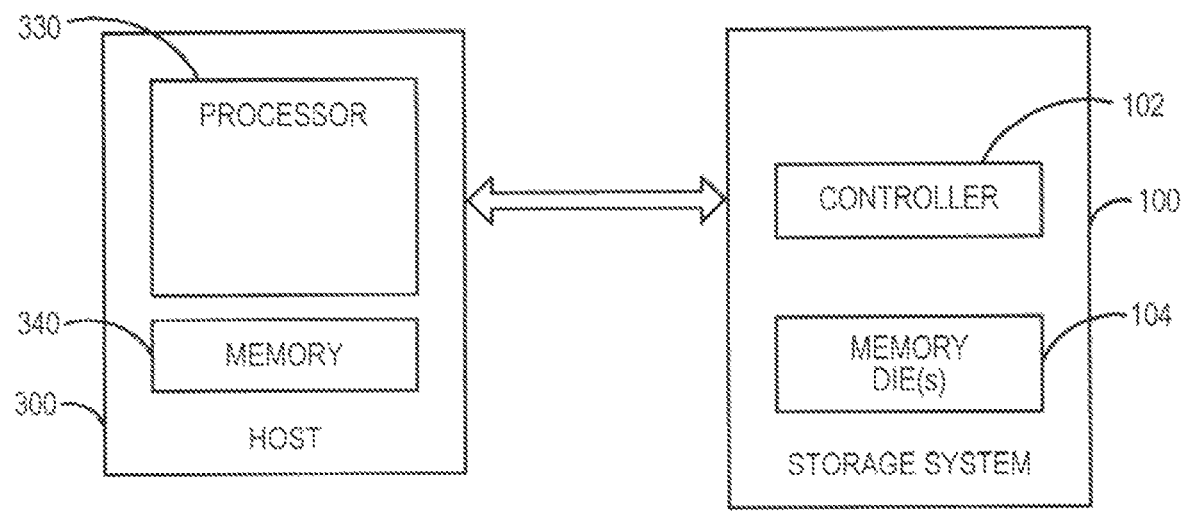
FIG. 3 is a block diagram of a host and a storage system of an embodiment.

Turning again to the drawings, FIG. 3 is a block diagram of a host 300 and storage system (sometimes referred to herein as a device) 100 of an embodiment. The host 300 can take any suitable form, including, but not limited to, a computer, a mobile phone, a digital camera, a tablet, a wearable device, a digital video recorder, a surveillance system, etc. The host 300 comprises a processor 330 that is configured to send data (e.g., initially stored in the host's memory 340 (e.g., DRAM)) to the storage system 100 for storage in the storage system's memory 104 (e.g., non-volatile memory dies). While the host 300 and the storage system 100 are shown as separate boxes in FIG. 3, it should be noted that the storage system 100 can be integrated in the host 300, the storage system 100 can be removably connected to the host 300, and the storage system 100 and host 300 can communicate over a network. It should also be noted that the memory 104 can be integrated in the storage system 100 or removably connected to the storage system 100.

As discussed above, in one embodiment, the memory 104 is organized in a plurality of blocks, where each block comprises a plurality of wordlines. Each wordline is organized in a plurality of programming segments, or strings. Also, the cells in the memory 104 can be configured to store one bit per memory cell (SLC memory) or multiple bits per memory cell (MLC) memory. Some configurations of MLC memory can store two bits per memory cell, while other configurations of MLC memory can store three bits per memory cell (TLC) memory or more (e.g., QLC memory stores 4 bits per cell). Also, a pseudo multi-level cell (pMLC) memory refers to a TLC memory that is used in a way that reduces the number of bits stored in each cell from three to two, which can increase the duration and reliability of the memory. As such, it may be desirable to store more-important data in pMLC memory than in TLC memory.

One problem that can occur in programming the memory 104 is that errors can be created in certain memory cells after other memory cells have been programmed. This is referred to as "program disturb." A disturb in a given string can be caused when the other strings in a wordline are being programmed. Depending on what string is impacted, the disturb effect on a string can occur before or after that string is programmed. Some disturb signatures have a specific string pattern to them, and, in some situations, the effect of the disturb on the string is masked. That is, if the disturb comes before the string is programmed, the majority of the bits in the string will be moved to higher levels, in which case the bit errors can be minimized. The number of bits moved to higher levels is dependent on the number of levels (bits per cell) currently being used. So, error counts go up when using the memory 104 as pMLC, which is where some of the most-important data may be stored.

More specifically, a disturb that happens prior to the programming can be masked by the program operation itself. The masking happens because the cells that are disturbed are mostly translated to higher states above where they are disturbed to. With randomized data, the probability is that most cells will be programmed well above where the disturb errors were disturbed to. Typically, one would want to mask disturbs as much as possible. The masking of a disturb would not be a problem, except that the disturb is unmasked when switching from higher bits per cell (e.g., TLC) to lower bits per cell (e.g., pMLC). This can be counterintuitive, as usually MLC is less impacted by disturbs than TLC. However, the problem is that lower numbers of bits per cell usage of blocks is typically for important metadata, such as a logical-to-physical address map. So, when a disturb is unmasked for that type of data, the results can be problematic. The unmasking effect happens because there are fewer states above the disturbed cells to program. As will be explain further in the below examples, in moving from TLC to pMLC, the number of disturbed cells going to states above changes from ~87.5% to only ~75%, effectively doubling the disturb.

As usage is often the same across multiple blocks in the same stripe, when the disturb is unmasked in one block in the stripe, it is unmasked in all of the blocks in the stripe. As stripes can often be formed from dies with similar properties (i.e., on the same wafer and nearby each other), they can have an increased probability of causing a stripe failure if there is a process-related problem. Also, a disturb can come from programming a different string in the same wordline. If the last string (e.g., String 3 in a four-string wordline) is always programmed last, any disturb on String 3 from the other strings will be prior to programming String 3. So, if the interactions between strings is equal probability, the chances are greatest that it will be best masked on String 3, which allows for a greater probability of unmaskings happening on String 3, which further concentrates the failures into the same stripe.

Figure 4:
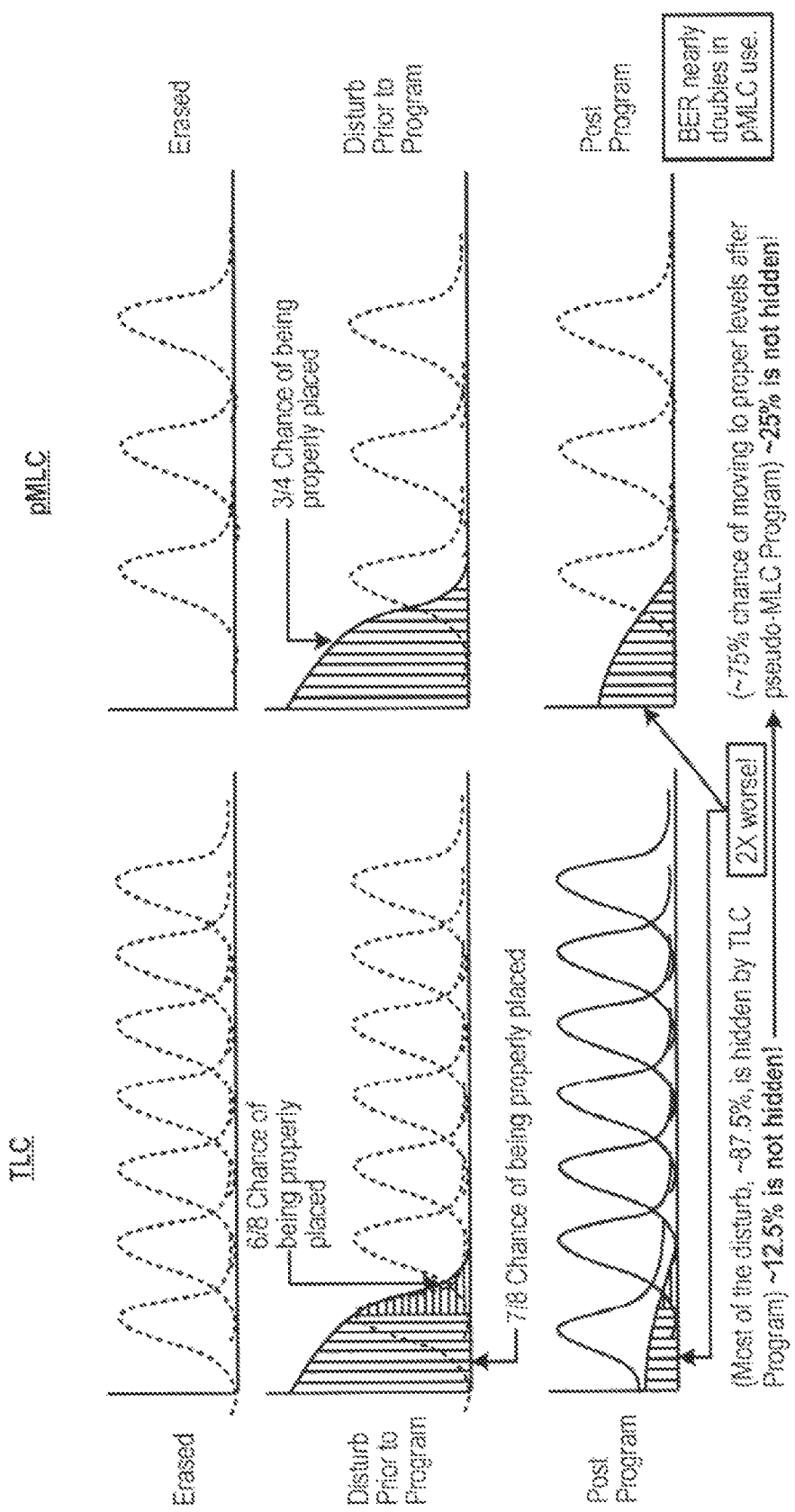
FIG. 4 is an illustration of a program disturb effect of an embodiment.
Figure 5:
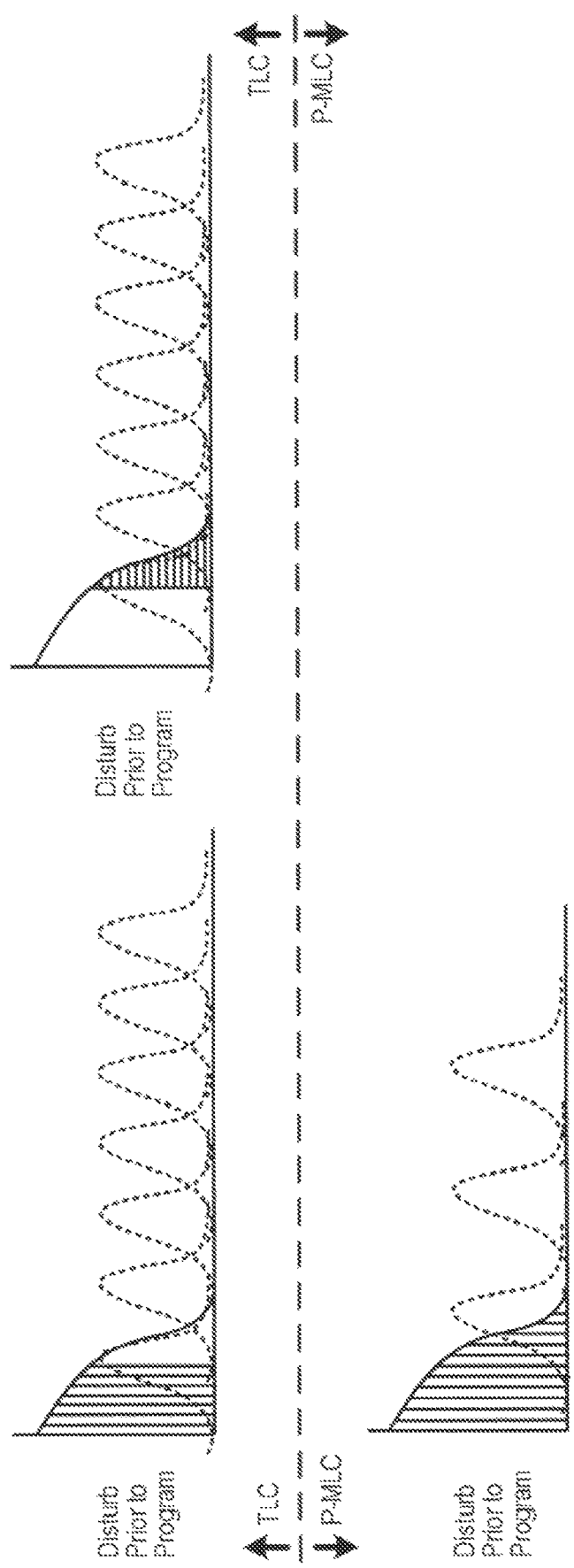
FIG. 5 is an illustration of probability distributions of an embodiment.

FIGS. 4 and 5 illustrates the masking issue in a TLC memory and a pMLC memory. In the example shown in FIG. 4, a memory cell is erased, and a disturb occurs prior to programming the memory cell. As shown in the left-hand side of FIG. 4, with a TLC memory cell, there is a ⅞ chance of the first state being properly placed and a ⅝ chance of the second state being properly placed. After programming, most of the disturb (~87.5%) is hidden by the TLC programming. As such ~12.5% of the disturb in not hidden. In contrast, with the pMLC memory cell, there is a ¾ chance of the first state being properly placed in a disturb before programming. Also, post-programming, there is a ~75% chance of moving to the problem levels, with ~25% of the disturb not being hidden. Thus, the bit error rate (BER) nearly doubles in the pMLC use case.

This phenomenon is further illustrated in FIG. 5. As shown in FIG. 5, in the TLC use case, there is a ⅞ chance of proper placement, as the shaded cells have seven states above them, and the data is randomized. Thus, there are seven chances in eight that the memory cells can still go the right level despite being disturbed prior to programming. In the example shown in the right-side of FIG. 5, there is a ⅝ chance of being properly placed, as the shaded cells have six states above them, and the data patterns are randomized. That is, there are six chances in eight that the cells can still go to the right level despite being disturbed prior to program. However, in the pMLC use case, there is a ¾ chance of being properly placed, as the shaded cells have three states above them, and the data patterns are randomized. So, there are three chances in four that the cells can still go to the right level despite being disturbed prior to program.

The following embodiments can be used to address the problem. In general, in these embodiments, the controller 102 of the storage system 100 is configured to change an order in which a plurality of strings are programmed in each of the plurality of wordlines, such that a last string programmed in each of the plurality of wordlines varies. Changing the programming order in this way allows the disturb to be caught in a timely manner (e.g., where an error correction operation (e.g., XOR) in the controller 102 can recover the error), rather than masking the problem and having it occur under pMLC use, potentially on multiple memory dies. That is, changing the programming order can better highlight a program disturb on the same wordline, so that it is found earlier and at a more-convenient time, rather than letting it build up and then increase significantly under pMLC usage. Changing the string order of the programming makes it possible for the disturb to happen after programming the string. That is, changing the programming order can better highlight a program disturb on the same wordline by changing the order of the programming, so that the last program string changes from wordline-to-wordline. In other embodiments, the programming order can also change from cycle-to-cycle and/or from memory-die-to-memory die (e.g., to further reduce the probability of stripe failures due to mechanisms that may have a string or program-ordering sensitivity). That is, some wordlines are more sensitive than others, so starting on a different string for a different cycle (and/or memory die) may be beneficial. Also, a randomized starting string can be used, e.g., for each super block, block, or wordline.

An example of changing the programming order is shown in FIG. 6. As shown in FIG. 6, some wordlines are more sensitive than others, so starting on a different string for each cycle would be ideal. In this example, the programming pattern is repeated every four wordlines, with the last string programmed being String3, String0, String1, and String2, respectively. Different pattern types and frequencies can be used. Also, as will be explained in more detail below, while the programming order of all of the strings are varied in this example, in other examples, only the programming of the last string or some subset of strings (e.g., all but the first string) is varied.

Figure 7:
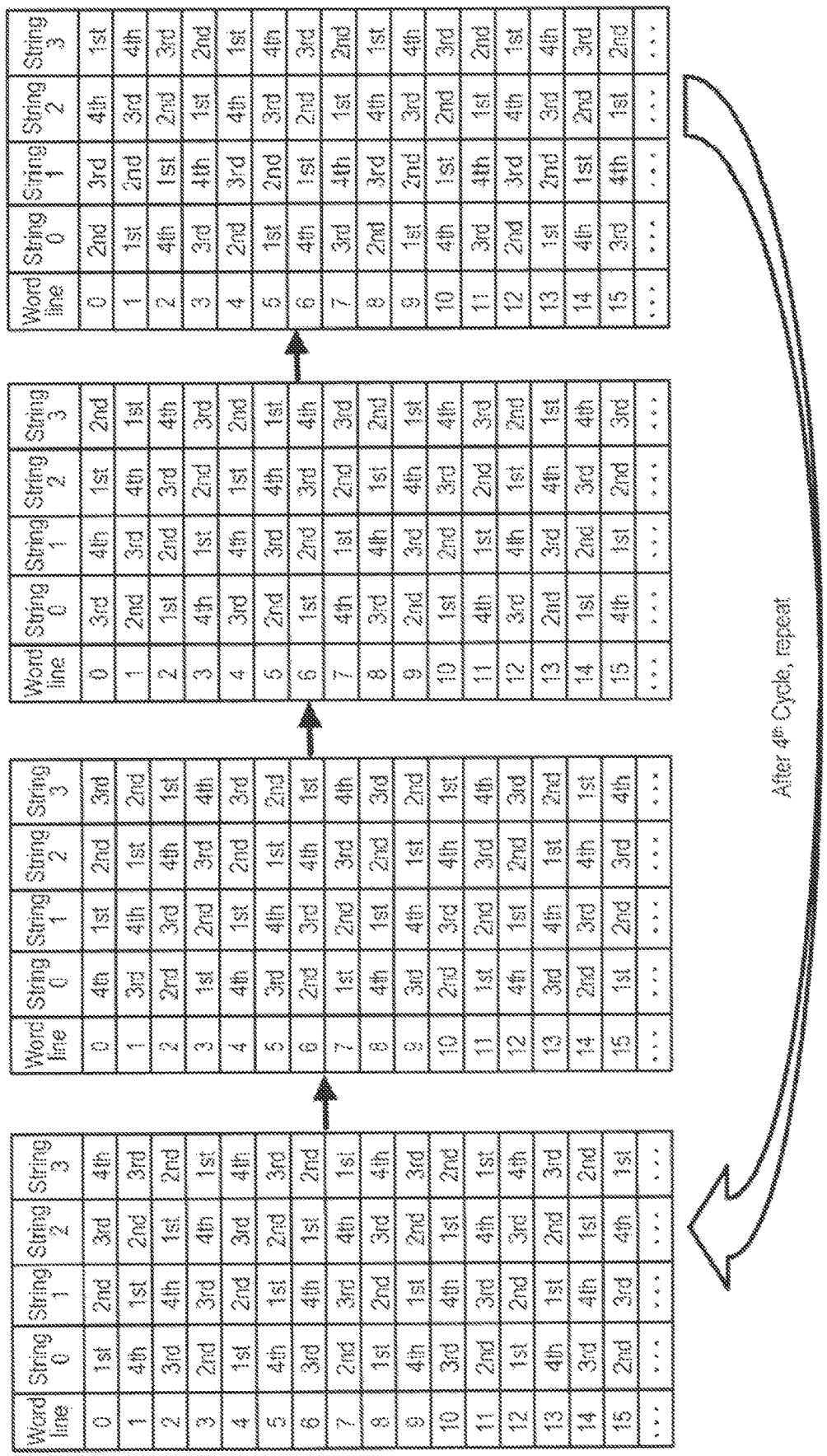
FIG. 7 is an illustration of a program reordering method of an embodiment that varies across program-erase cycles.
Figure 8:
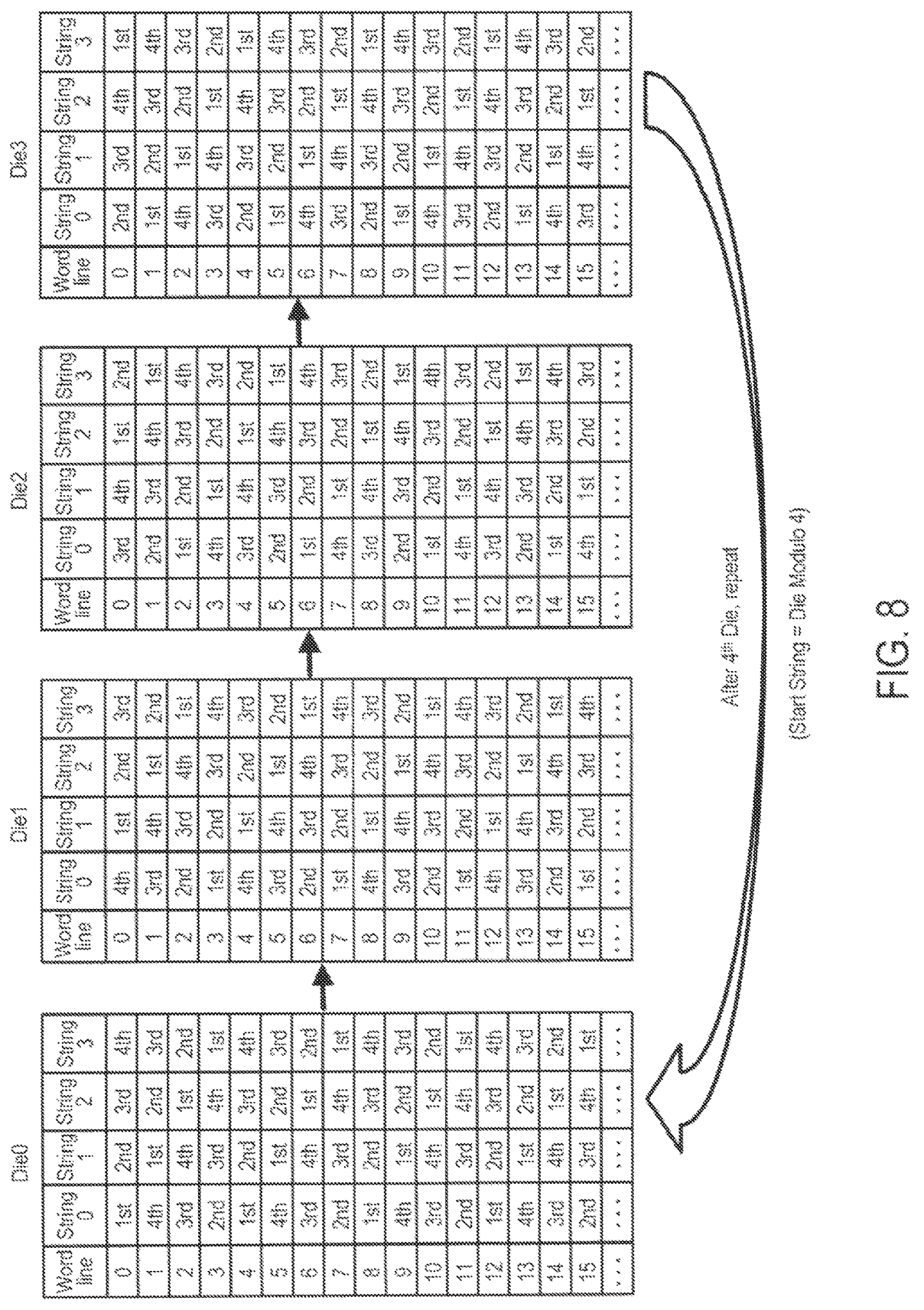

As mentioned above, the programming order can also vary across program-erase cycles. This is shown in FIG. 7, where the starting string equals cycle modulo 4. So, after the fourth program-erase cycle, a given programming pattern repeats. As also mentioned above, the programming order can additionally or alternative vary across memory dies. This is shown in FIG. 8, where the starting string equals die modulo 4. So, after the fourth memory die, a given programming pattern repeats. It should be noted that a memory die can be a logical or physical reference, and the program order can be varied to reduce the probability of a stripe failure.

Figure 9:
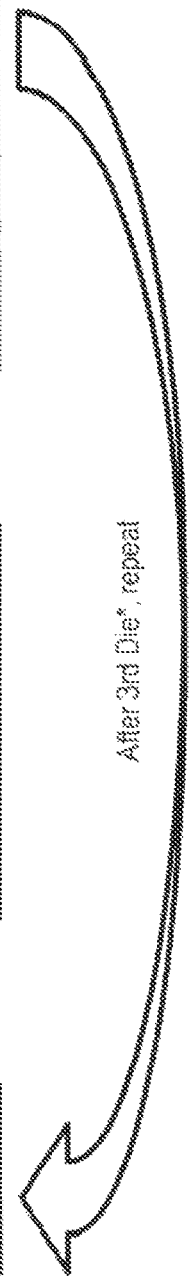
FIG. 9 is an illustration of a program reordering method of an embodiment in which a first string of a wordline is always programmed first.

As further mentioned above, while the previous examples show variation in the programming order of all of the strings, the variation may only be for one or some other subset of strings. For example, in one embodiment, only the programming of the last string varies. In another example, the programming of some, but not all, of the strings varies. This is illustrated in FIG. 9. As shown in FIG. 9, the first string in each wordline is always programmed first, with the programming of the other strings varying. Such an arrangement may be desired, for example, when the first string is used to verify the memory 104, with information from that verification being used in programming the other strings.

Figure 10:
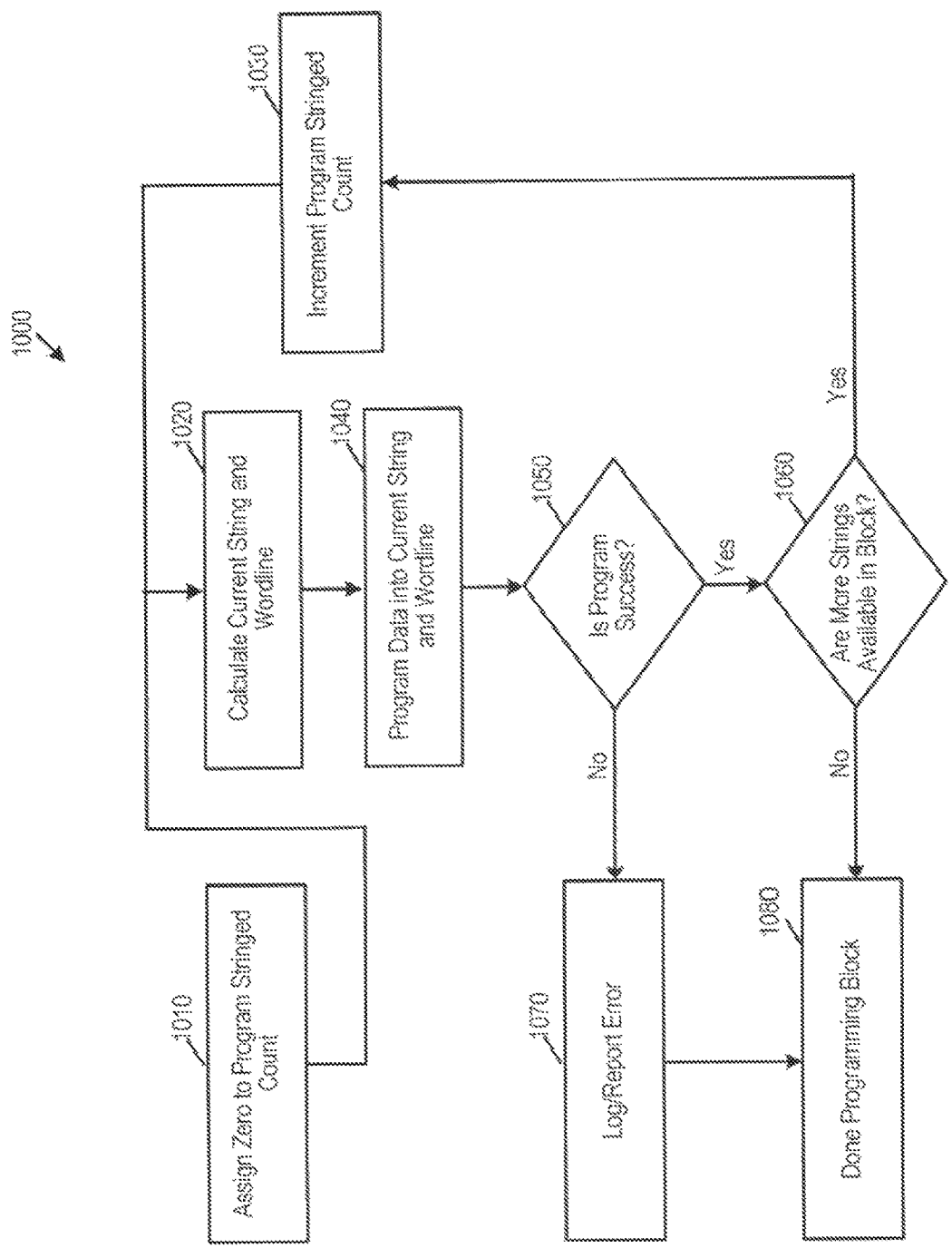
FIG. 10 is a flowchart of a method of an embodiment for program reordering to mitigate program disturbs.

Turning again to the drawings, FIG. 10 is a flow chart 1000 of a method of an embodiment for program reordering to mitigate program disturbs. As shown in FIG. 10, in this method, the controller 102 first assigned zero to a stringed count (act 1010). Next, the controller 102 calculates the current string and wordline (act 1020). While any suitable mechanism can be used to perform this calculation, in one embodiment, to calculate the current string and wordline to be programmed, the following formulas are used:

Current String=Modulo((Programmed String Count+ PE Cycle+Die Number+Block Number),(Number of Strings))

Current Wordline=Int((Programmed String Count)/ (Number of Strings)), where Die Number can be a logical or physical number, where Block Number is optional, and where, if the string needs to be the same across planes, it could be a Block-Pairs/Groups Number rather than a Block Number. Also, the Number of Strings here refers to the number of different strings. Of course, this is just one implementation, and other implementations can be used.

Next, the controller 102 programs data into the current string and wordline (act 1040). The controller 102 then determines if the programming was successful (act 1050). If the programming was unsuccessful, the controller 102 generates a log/error report (act 1070) and concludes the programming of the block (act 1080). However, if the programming was successful, the controller 102 determines if there are any more strings available in the block (act 1060). If no more strings are available, the programming of the block is concluded (act 1080). However, if there are more strings available, the controller 102 increments the programmed string count (act 1030) and loops back to act 1020.

There are many alternatives that can be used with these embodiments. For instance, in the above examples, a program disturb error was unmasked when using TLC memory as pMLC memory. More generally, a program disturb error can be unmasked when using memory cells configured to store X number of bits per cell to store fewer than X number of bits per cell (e.g., quad-level cells (QLC) used a pseudo-TLC memory, or MLC memory used as pseudeo-SLC memory).

There are several alternatives that can be used with these embodiments. For example, after multiple rounds of changing the order of programming the strings, a pattern may be observed that an error repeatedly occurs on a certain string (e.g., String 2). Based on that observation, that string can be made the last-programmed string in the future to help mitigate the program disturb.

Also, if it is observed that the program disturb occurs with a certain usage condition of a block, the storage system 100 can avoid using the block in that usage condition, to mask the program disturb. For example, if it is observed that an error repeatedly occurs on String 2 under a certain usage condition of the block, a different usage condition of the block can be used in the future when String 2 is made the last-programmed string.

Also, if it is observed that the program disturb occurs within blocks a certain block pattern, such as all blocks of a block decoder signature (e.g., having the same modulo (block, 16) value(s)), then blocks of that same pattern may not be used for a lower number of bits-per-cell condition, as that will likely amplify the disturb.

Finally, as mentioned above, any suitable type of memory can be used. Semiconductor memory devices include volatile memory devices, such as dynamic random access memory ("DRAM") or static random access memory ("SRAM") devices, non-volatile memory devices, such as ReRAM, electrically erasable programmable read only memory ("EEPROM"), flash memory (which can also be considered a subset of EEPROM), ferroelectric random access memory ("FRAM"), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional (2D) memory structure or a three dimensional (3D) memory structure.

In a 2D memory structure, the semiconductor memory elements are arranged in a single plane or a single memory device level. Typically, in a 2D memory structure, memory elements are arranged in a plane (e.g., in an x-z direction plane) that extends substantially parallel to a major surface of a substrate that supports the memory elements. The substrate may be a wafer over or in which the layer of the memory elements is formed or it may be a carrier substrate that is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A 3D memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements in each column. The columns may be arranged in a 2D configuration, e.g., in an x-z plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the 2D and 3D structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, which are intended to define the scope of the claimed invention. Finally, it should be noted that any aspect of any of the embodiments described herein can be used alone or in combination with one another.

What is claimed is:

1. A storage system comprising:
    a memory comprising memory cells configured to store X number of bits per memory cell, wherein X is a positive integer and wherein the memory is organized into a plurality of wordlines, wherein each wordline comprises a plurality of programming segments; and
    a controller configured to:
        for each of a plurality of program cycles, change, in each of the plurality of wordlines and with respect to a prior wordline, which of the plurality of programming segments is a last programming segment programmed;
        after the plurality of program cycles, observe a pattern showing that an error repeatedly occurred on a certain programming segment of the plurality of programming segments;
        based on the observed pattern, select the certain programming segment to be the last programming segment programmed;
        detect a number of program disturb errors in the memory; and
        correct the program disturb errors using the error correction operation.

2. The storage system of claim 1, wherein the memory comprises triple-level cells.

3. The storage system of claim 1, wherein the memory comprises quad-level cells.

4. The storage system of claim 1, wherein the controller is further configured to change, in each of the plurality of wordlines, a programming order of at least one other one of the plurality of programming segments.

5. The storage system of claim 4, wherein the controller is further configured to change, in each of the plurality of wordlines, a programming order of all of the plurality of programming segments.

6. The storage system of claim 1, wherein the controller is further configured to program a first programming segment in each of the plurality of wordlines first.

7. The storage system of claim 1, wherein the memory further comprises a plurality of memory dies, and wherein the controller is further configured to change a programming order of at least one of the plurality of programming segments across memory dies.

8. The storage system of claim 1, wherein the memory further comprises a block of memory cells, and wherein the controller is further configured to change a programming order of at least one of the plurality of programming segments across program-erase cycles of the block.

9. The storage system of claim 1, wherein the memory further comprises a plurality of blocks of memory cells, and wherein the controller is further configured to randomize a starting programming segment to be programmed in each of the plurality of blocks.

10. The storage system of claim 1, wherein the controller is further configured to randomize a starting programming segment to be programmed in each of the plurality of wordlines.

11. The storage system of claim 1, wherein the memory comprises a three-dimensional memory.

12. In a storage system comprising a memory comprising memory cells configured to store X number of bits per memory cell, wherein X is a positive integer, wherein the memory is organized into a plurality of wordlines, wherein each wordline comprises a plurality of programming segments, and wherein the memory comprises a plurality of memory dies organized in a stripe, a method comprising:
    changing, in each memory die in the stripe, which of the plurality of programming segments is a last programming segment programmed;
    observing a pattern showing that an error repeatedly occurred on a certain programming segment of the plurality of programming segments;
    based on the observed pattern, selecting the certain programming segment to be the last programming segment programmed;
    detecting a number of program disturb errors in the memory; and
    correcting the program disturb errors using the error correction operation.

13. The method of claim 12, further comprising:
    determining whether data was programmed successfully into a current programming segment.

14. The method of claim 13, further comprising:
    in response to determining that the data was not programmed successfully, generating an error report.

15. The method of claim 13, further comprising:
    in response to determining that the data was programmed successfully, determining whether there are any more programming segments available to be programed.

16. A storage system comprising:
    a memory comprising memory cells configured to store X number of bits per memory cell, wherein X is a positive integer and wherein the memory is organized into a plurality of wordlines, wherein each wordline comprises a plurality of programming segments;
    means for, for each of a plurality of program cycles, changing, in each of the plurality of wordlines and with respect to a prior wordline, which of the plurality of programming segments is a last programming segment programmed;

means for, after the plurality of program cycles, observing a pattern showing that an error repeatedly occurred on a certain programming segment of the plurality of programming segments;
means for, based on the observed pattern, selecting the certain programming segment to be the last programming segment programmed;
means for detecting a number of program disturb errors in the memory; and
means for correcting the program disturb errors using the error correction operation.

* * * * *